(12) United States Patent
Sajjad et al.

(10) Patent No.: US 9,570,559 B2
(45) Date of Patent: Feb. 14, 2017

(54) GRAPHENE DEVICE INCLUDING ANGULAR SPLIT GATE

(71) Applicants: Redwan Noor Sajjad, Charlottesville, VA (US); Avik Ghosh, Charlottesville, VA (US)

(72) Inventors: Redwan Noor Sajjad, Charlottesville, VA (US); Avik Ghosh, Charlottesville, VA (US)

(73) Assignee: University of Virginia Patent Foundation, Charlottesville, VA (US)

( * ) Notice: Subject to any disclaimer, the term of this patent is extended or adjusted under 35 U.S.C. 154(b) by 0 days.

(21) Appl. No.: 14/212,279

(22) Filed: Mar. 14, 2014

(65) Prior Publication Data

US 2015/0263098 A1    Sep. 17, 2015

(51) Int. Cl.

| | |
|---|---|
| *H01L 29/06* | (2006.01) |
| *H01L 29/08* | (2006.01) |
| *H01L 29/16* | (2006.01) |
| *H01L 29/66* | (2006.01) |
| *H01L 29/423* | (2006.01) |
| *H01L 29/778* | (2006.01) |
| *H01L 29/78* | (2006.01) |
| *H01L 29/51* | (2006.01) |

(52) U.S. Cl.
CPC ....... *H01L 29/1606* (2013.01); *H01L 29/4238* (2013.01); *H01L 29/66045* (2013.01); *H01L 29/778* (2013.01); *H01L 29/7831* (2013.01); *H01L 29/518* (2013.01)

(58) Field of Classification Search
CPC ...... H01L 29/1606; B82Y 10/00; B82Y 40/00; B82Y 30/00; B82Y 20/00; C01B 31/0438; G11C 2213/35

USPC .................................................. 257/29, 613
See application file for complete search history.

(56) References Cited

U.S. PATENT DOCUMENTS

| | | | |
|---|---|---|---|
| 2009/0315631 A1 | 12/2009 | Ham et al. | |
| 2010/0102292 A1* | 4/2010 | Hiura | B82Y 10/00 257/9 |
| 2011/0089404 A1* | 4/2011 | Marcus | B82Y 30/00 257/29 |

(Continued)

OTHER PUBLICATIONS

Gupta et al., Performance evaluation of electro-optic effect based graphene transistors, Aug. 3, 2012, Royal Society of Chemistry, Nanoscale, 2012, 4, 6365-6373.*

(Continued)

*Primary Examiner* — David Chen
(74) *Attorney, Agent, or Firm* — Schwegman Lundberg & Woessner, P.A.

(57) ABSTRACT

An electronic device can include a dielectric layer, and a graphene layer including a first surface located upon the dielectric layer. The electronic device can include a first electrode, a second electrode, and a third electrode each located upon the dielectric layer on a surface opposite the graphene layer. The first and second electrodes can be spaced apart along a longitudinal axis of the electronic device to define a first gap between the first and second electrodes, and the second and third electrodes are spaced apart along the longitudinal axis of the electronic device to define a second gap between the second and third electrodes. At least one of the first gap or the second gap can be angled so as to be neither parallel nor perpendicular to the longitudinal axis of the electronic device.

14 Claims, 9 Drawing Sheets

(56) References Cited

U.S. PATENT DOCUMENTS

| | | | | |
|---|---|---|---|---|
| 2011/0089995 | A1* | 4/2011 | Heo | H01L 29/1606 327/534 |
| 2012/0112250 | A1* | 5/2012 | Chung | H01L 29/1606 257/288 |
| 2013/0088283 | A1* | 4/2013 | Lee | H01L 29/0673 327/534 |
| 2013/0221329 | A1* | 8/2013 | Liang | H01L 29/66977 257/29 |
| 2013/0309776 | A1* | 11/2013 | Drndic et al. | 436/94 |
| 2013/0330885 | A1* | 12/2013 | Chen et al. | 438/151 |
| 2014/0014905 | A1* | 1/2014 | Lee | H01L 29/78 257/29 |
| 2014/0077161 | A1* | 3/2014 | Duan | B82Y 10/00 257/29 |
| 2014/0299839 | A1* | 10/2014 | Shepard | H01L 29/1606 257/29 |

OTHER PUBLICATIONS

Huard, B., et al., "Transport Measurements Across a Tunable Potential Barrier in Graphene", Phys. Rev. Lett., 98, (2007), 236803 (1-4).

Jang, M. S, et al., "Graphene field effect transistor without an energy gap", Proc Natl Acad Sci U S A., 110(22), (May 28, 2013), 8786-9.

Raza, Hassan, "Electronic structure modulation for low-power switching", Nanoscale Research Letters, 8, (2013), 74 (1-5).

Sajjad, Redwan N, et al., "Atomistic deconstruction of current flow in graphene based hetero-junctions", Journal of Computational Electronics, 12(2), (Jun. 2013), 232-247.

Sajjad, Redwan N, et al., "High efficiency switching using graphene based electron "optics"", Appl. Phys. Lett., 99, (2011), 123101.

Sajjad, Redwan N, "Manifestation of chiral tunneling at a tilted graphene p-n junction", Phys. Rev. B, 86, (2012), 155412.

Sajjad, Redwan N, et al., "Manipulating chiral transmission by gate geometry: switching in graphene with transmission gaps", ACS Nano, vol. 7, No. 11, DOI: 10.1021/nn403336n, (2013), 9808-9813.

Williams, J. R., et al., "Quantum Hall effect in a gate-controlled p-n junction of graphene", Science, 317(5838), (Aug. 3, 2007), 638-41.

Wu, Yanqing, et al., "Quantum Behavior of Graphene Transistors near the Scaling Limit", Nano Lett., 12(3), (2012), 1417-1423.

* cited by examiner

GRAPHENE DEVICE INCLUDING ANGULAR SPLIT GATE

BACKGROUND

Graphene is an allotrope of carbon comprising a sheet of carbon atoms generally including a single atomic layer thickness. Graphene possesses exceptional electronic and material properties, including an ultra-high electron mobility. However, graphene alone is not generally considered to be suitable as a switching medium because it lacks a bandgap. A bandgap can be established structurally in graphene, however such a structural bandgap can degrade or destroy the band structure, which hinders the ultra-high electron mobility otherwise provided by graphene. Accordingly, graphene devices having structurally-established bandgaps generally deliver a poor ON-state current.

OVERVIEW

The present inventors have recognized, among other things, that a conductivity of a graphene sheet can be modulated generally without structural distortion of the graphene lattice, which can preserve electron-hole symmetry and can preserve a superior electron mobility. Such modulation can include preserving a density of states by opening a "transmission gap" in graphene. The transmission gap can be created at least in part using characteristics of graphene including photon-like transport behavior (e.g., "electron optics") and a chiral property of tunneling behavior at an electrostatically-controlled junction in the graphene sheet. Such a junction resistance can be anisotropic, which can be used to elicit electron redirection at the junction by virtue of the gate conductor geometry (e.g., using one or more of a shape of the gate conductor or an orientation of a gap between gate conductors).

In an example, an electronic device can include a dielectric layer, and a graphene layer including a first surface located upon the dielectric layer. The electronic device can include a first electrode, a second electrode, and a third electrode each located upon the dielectric layer on a surface opposite the graphene layer. The first and second electrodes can be spaced apart along a longitudinal axis of the electronic device to define a first gap between the first and second electrodes, and the second and third electrodes are spaced apart along the longitudinal axis of the electronic device to define a second gap between the second and third electrodes. At least one of the first gap or the second gap can be angled so as to be neither parallel nor perpendicular to the longitudinal axis of the electronic device.

In an example, the graphene layer includes a second surface opposite the first surface and the electronic device includes a fourth electrode located upon the second surface of the graphene layer at a location along the longitudinal axis of the electronic device wherein at least a portion of the first electrode is laterally overlapping with the fourth electrode, and the electronic device includes a fifth electrode located upon the second surface of the graphene layer at a location along the longitudinal axis of the electronic device wherein at least a portion of the third electrode is laterally overlapping with the fifth electrode. The fourth electrode can be configured as a source electrode, and the fifth electrode can be configured as a drain electrode. The first through third electrodes can be configured as gate electrodes.

This overview is intended to provide an overview of subject matter of the present patent application. It is not intended to provide an exclusive or exhaustive explanation of the invention. The detailed description is included to provide further information about the present patent application.

Figure 1:
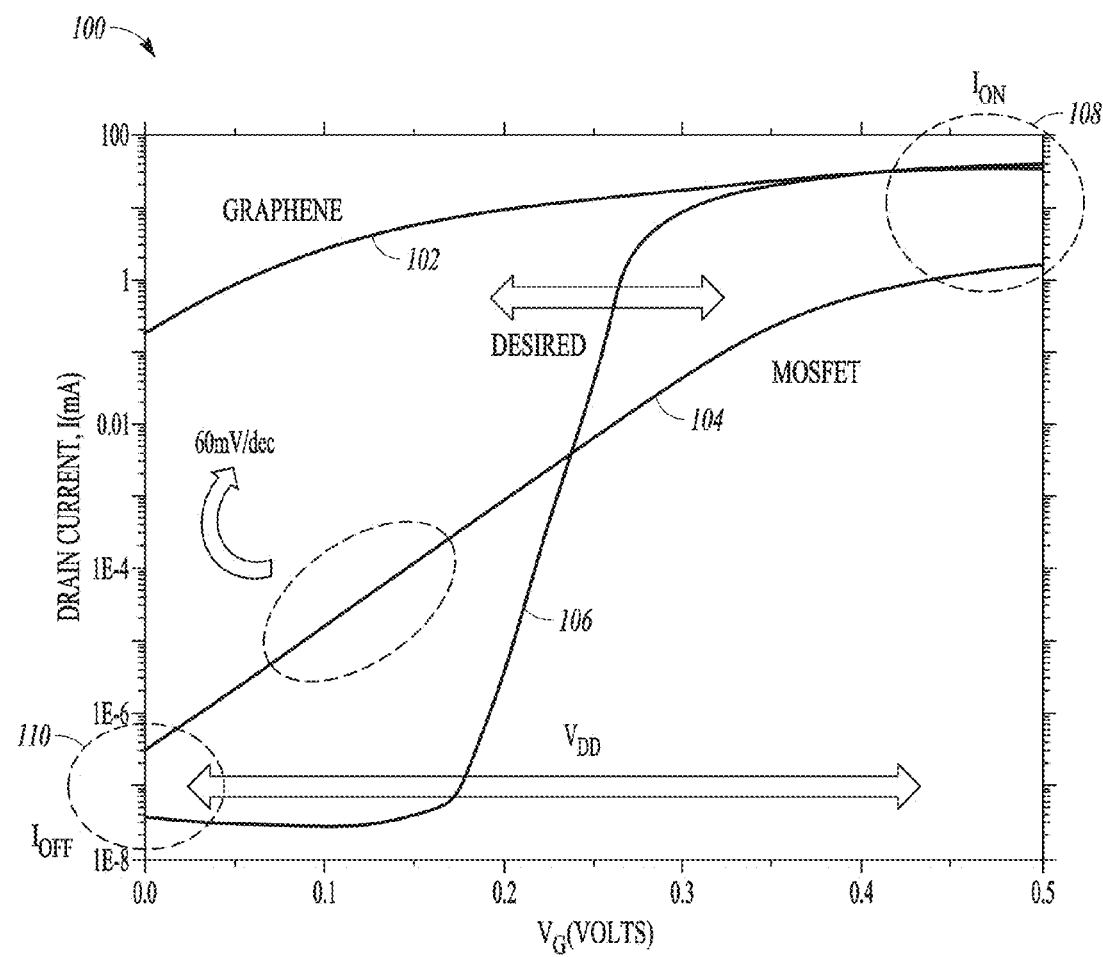
FIG. 1 illustrates generally illustrative examples of various current-to-voltage relationships, such as including an example of a graphene-based switch different from the angled-gate examples described herein, a practical Metal-Oxide-Semiconductor Field Effect Transistor (MOSFET), and an idealized representation of a desired switching characteristic.

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Interest in graphene-based electronic devices is motivated at least in part by unique material and electronic properties of graphene. Graphene generally provides two bands deriving from bonding-antibonding combinations of neighboring carbon $p_z$ dimer (e.g., "pseudo-spin") basis sets belonging to the same 2-D crystallographic point group. Corresponding gapless low-energy excitations can generate an ultralow electron effective mass, while the orthogonality of the pseudo spins generally suppresses 1-D back-scattering, providing a high electron mobility. However, such gaplessness results in only modest switching properties of generally-available graphene devices, with a subthreshold current generally changing linearly rather than exponentially as a function of voltage. Conversely, opening a bandgap structurally in graphene by chemical modifications or quantum confinement generally reduces mobility due to an asymptotic constraint on short wavelength behavior, rendering high efficiency switching in structurally-modified graphene devices a considerable challenge.

The present inventors have recognized, among other things, that phase correlation between conduction and valence band states can provide novel forms of electron flow in graphene. At a graphene p-n junction (GPNJ), a scattering of the individual pseudospins leads to electron trajectories that are reminiscent of electromagnetic wave scattering at dielectric interfaces. Because a radius of a 2-D Fermi surface varies with local potential across an interface, electrons having large angles of incidence at a higher electrostatically "doped" side of the interface are generally unable to conserve their transverse quasi-momentum components across the interface (e.g., a junction) and thus undergo total internal reflection. By contrast, electrons having incidence within a critical angle "refract" into the opposite side, diverging if the dopings have the same sign (e.g., $n^+n$ or $p^+p$ junctions), or converging if the dopings have opposite sign (e.g., p-n junctions). A varying electrostatic doping thus turns graphitic electrons into quantum mechanical analogues of negative index metamaterials. Such electron "optics" facilitate modulation of a conductivity of a graphene sheet using split gate structures, such as shown and described in various examples herein, such as in FIGS. 3 and 5.

FIG. 1 illustrates generally illustrative examples of various current-to-voltage relationships, such as including an example of a graphene-based switch 102 different from the angled-gate examples described herein, an example of a practical Metal-Oxide-Semiconductor Field Effect Transistor (MOSFET) 104, and an idealized representation of a desired switching characteristic 106. A significant tradeoff can exist between switching performance (e.g., speed) and heat generation (e.g., power dissipation). A switching device that can cycle at high frequency high frequency, (e.g., 'f') generally provides power dissipation that is a function of gate capacitance, (e.g., "C") and supply voltage (e.g., "$V_{DD}$"), and such a power dissipation can be represented as $$P = \frac{1}{2} CV_{DD}^2 f.$$

A high ON-to-OFF current ratio is generally desired for reliability (e.g., a ratio on the order of ~$10^6$) and accordingly a slope of current-voltage can be used to determine a nominal $V_{DD}$-swing value. Reduction of power dissipation can be achieved by lowering the change in $V_{DD}$ required for switching operations, which for complementary metal-oxide-semiconductor (CMOS) devices is generally set by a thermionic emission principle for electrons over a barrier and cannot be reduced beyond a certain level unless a different device technology is used. Also, a high ON current, (e.g., $I_{ON}$ 108) is desired to provide high drive capability, such as for enhanced fan-out or for rapidly charging inputs to other switching devices. Accordingly, a desired transfer curve 106 with steeper transition, high ON current, and low OFF current can be regarded as a goal. A transfer curve 102 for generally-available graphene switches (but different than the angled-gate examples described herein), closely matches a desired $I_{ON}$ 108 (e.g., about 10 milliamps per micrometer), which is more than 10 times greater than Silicon CMOS, but fails to meet a desired low OFF current (e.g., $I_{OFF}$ 110).

Figure 2:
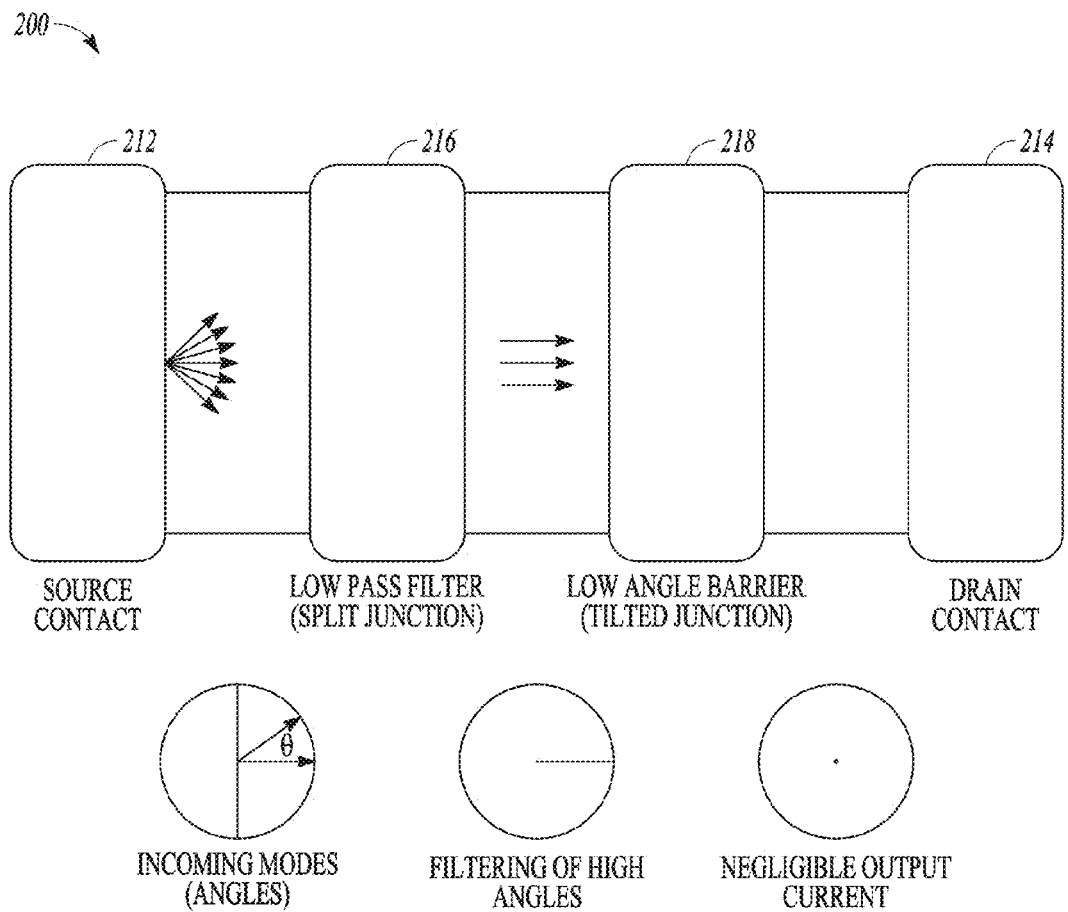
FIG. 2 illustrates generally a diagram showing sequential spatial suppression of electron modes using optical-like propagation of electrons in a graphene switching device having an angled gate structure.

FIG. 2 illustrates generally a diagram 200 showing sequential spatial suppression of electron modes using optical-like propagation of electrons in a graphene switching device having an angled gate structure. The present inventors have recognized that generally-available graphene switching devices do not provide a desired ON-to-OFF current ratio as mentioned above in relation to FIG. 1. However, taking advantage of optical-like propagation behavior of electrons allows manipulation of a "transmission" gap in an otherwise zero-bandgapped graphene device to create a new switching device configuration, as shown illustratively in FIG. 2.

Figure 5:
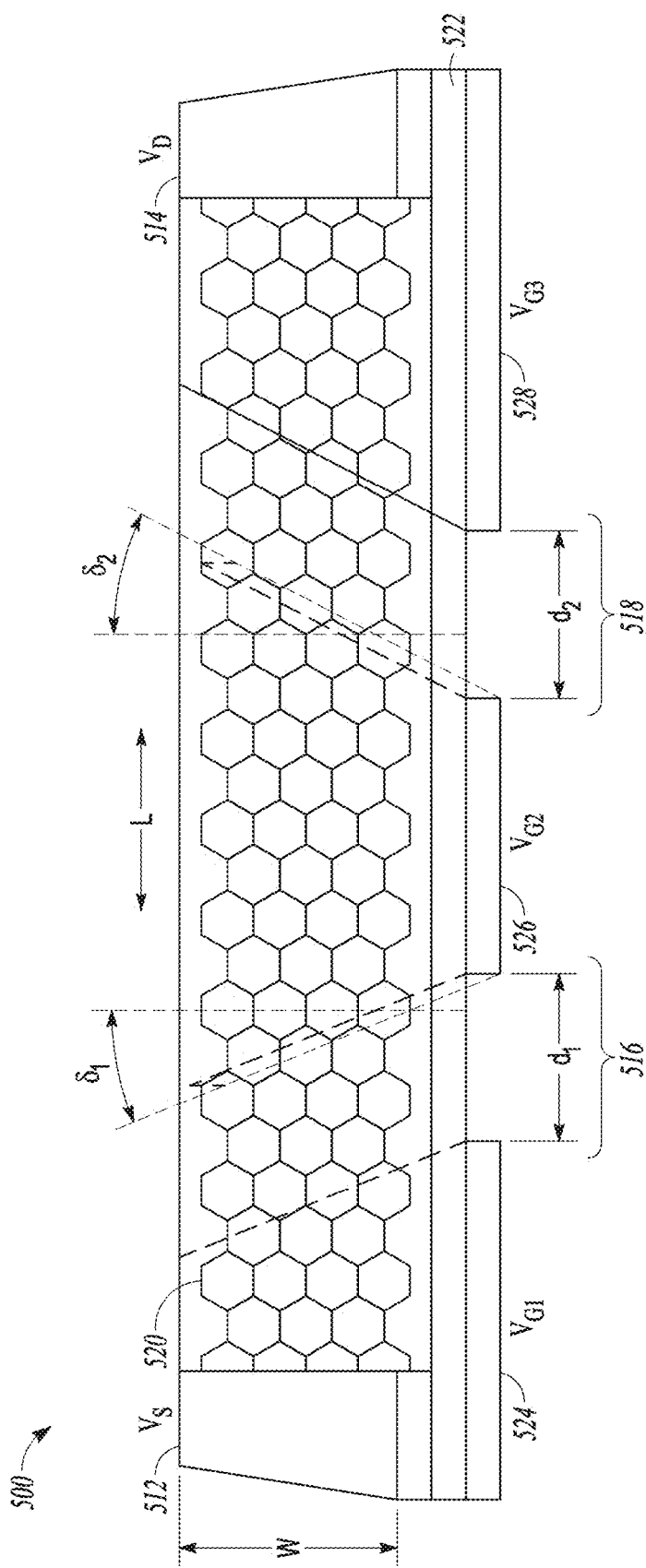
FIG. 5 illustrates generally a view of an illustrative example of a graphene switching device, such as can include a graphene layer upon a dielectric layer, and various electrodes to provide a dual angled-gate configuration.

In the illustrative example of FIG. 2, two junctions can be configured to act as a collimator-filter pair. A first junction 216 can be a smooth "split" junction whose potential varies smoothly from an n polarity of electrostatically-induced "doping" to a p polarity of electrostatically-induced doping. Generally, in such an "electrostatic doping" context, an n polarity can be established using a positive gate voltage (e.g., applied to a first "back gate" as shown in the examples of FIGS. 3 and 5) with respect to, for example, a voltage at a source contact 212, and a p polarity can be established such as by using a negative gate voltage, such as applied to a second "back gate," with respect the voltage at the source contact 212 or with respect to the first gate contact.

Due to an anisotropy of electron flow in graphene associated with the covalent chemistry of the carbon bonds, the first junction 216 can "filter" out high-incidence angle electrons with the effectiveness of such filtering controlled in part by a split width (e.g., a distance between the gate electrodes) and a gate voltage difference (e.g., a doping difference). The incidence angle can refer to the angle of incidence the electrons make in the plane of a graphene layer with respect to a line drawn across the graphene layer corresponding to the split location (e.g., in a plane of the page as shown in the view of FIG. 2).

A second junction 218 can be established to act as a barrier for the surviving low angle electrons that have propagated beyond the first junction 216. The second junction can include a split orientation that is angled with respect to a longitudinal axis of the device, such as to take advantage of a refractive electron transmission behavior. Using such behavior, when biased using adjacent gate structures (e.g., back gates as shown in FIGS. 3 and 5), the junction 218 can generally transmit electrons perpendicular to the axis of the split. In this manner, gate voltages used to establish the first and second junctions 216 and 218 can provide an electrostatically-controlled heterojunction pnp or npn configuration, for example, and in such a mode (e.g., OFF state) the device will choke off electron conduction between the source contact 212 and a drain contact 214. The present inventors refer to such a state as having induced a "transmission gap" in the graphene device. In another biasing state, such as with one or both splits approaching a homo-junction (e.g., a ppp or nnn configuration, or even an nnp or ppn configuration), a large on current can be passed across the uniform junction. Examples of dual-junction device structures are shown illustratively in FIGS. 3 and 5.

Figure 3:
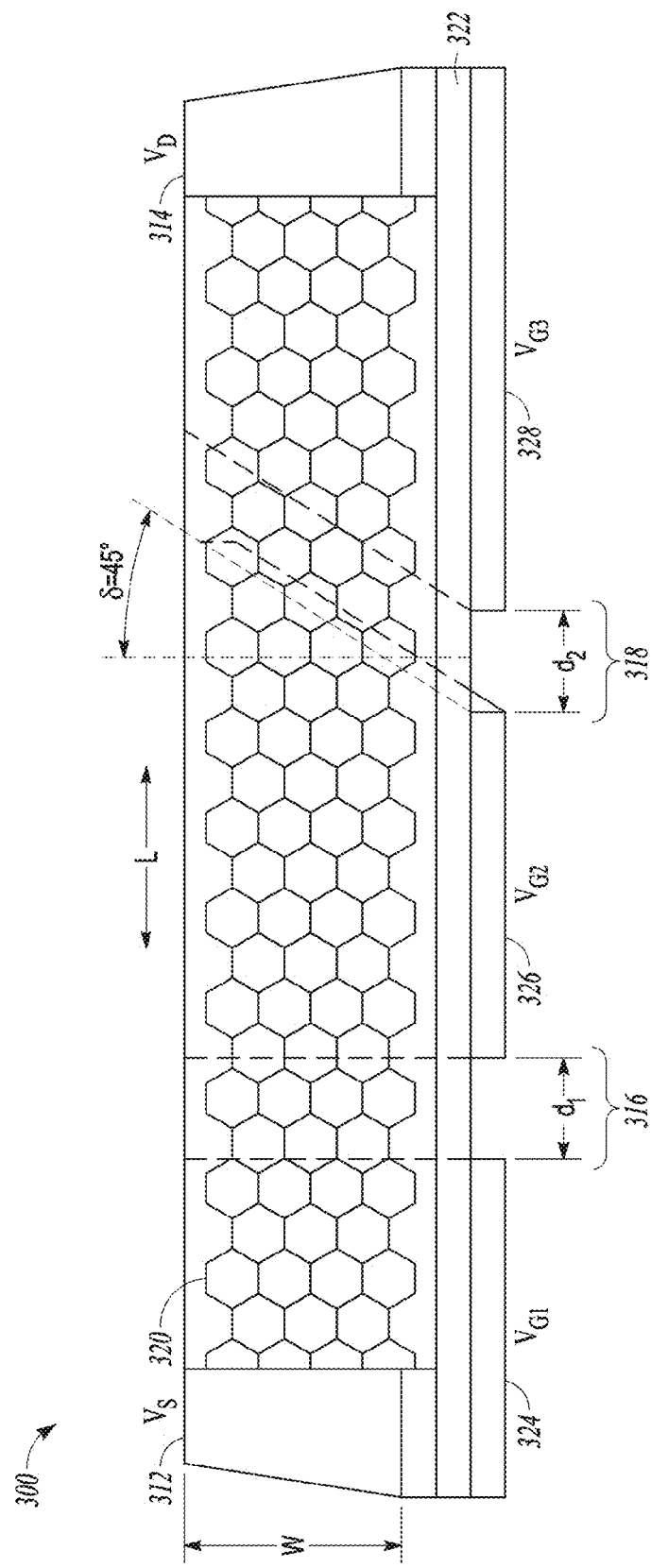
FIG. 3 illustrates generally a view of an illustrative example of a graphene switching device, such as can include a graphene layer upon a dielectric layer, and various electrodes, to provide an angled-gate configuration.

FIG. 3 illustrates generally a view of an illustrative example of a graphene switching device 300, such as can include a graphene layer 320 upon a dielectric layer 322 (e.g., boron nitride or one or more other materials), and various electrodes, to provide an angled-gate configuration. A first electrode 324, a second electrode 326, and a third electrode 328 can be configured as "back" gate electrodes located upon a surface of the dielectric layer 322 opposite the graphene layer 320. The gate electrodes can be separated laterally along the device 300, such as by a first gap having a length, $d_1$, and a second gap having a length, $d_2$. In the example of FIG. 3, the first gap is oriented to be orthogonal to a longitudinal axis of the device, L, and the second gap is oriented to be neither orthogonal nor parallel to the longitudinal axis of the device, L. Thus, the second gap and corresponding electrodes 326 and 328 can be referred to as a "tilted" or "angled" gate structure, with such angling referring to an angle, $\delta$, between an axis orthogonal to L, and a line defined by an edge of one or more of the gate electrodes, such as the second electrode 326 or the third electrode 328.

A fourth electrode 312 can be located upon the graphene layer 320, such as on a layer opposite the dielectric layer 322, and a fifth electrode 314 can be located upon the graphene layer 320 laterally separated from the fourth electrode 312. The first and second electrodes 324 and 326 can be used to establish a first electrostatically-induced junction in a first region 316 including the first gap, and the second and third electrodes 326 and 328 can be used to establish a second electrostatically-induced junction in a second region 318 including the second gap. The electrodes need not be metal, and can include one or more semiconductor materials, such as a doped semiconductor, polysilicon, or one or more other materials. The fourth electrode 312 can be configured as a source electrode, the fifth electrode 314 can be configured as a drain electrode, and the first through third electrodes 324, 326, 328 can be configured as gate electrodes, such as to provide a graphene switching device.

Figure 4A:
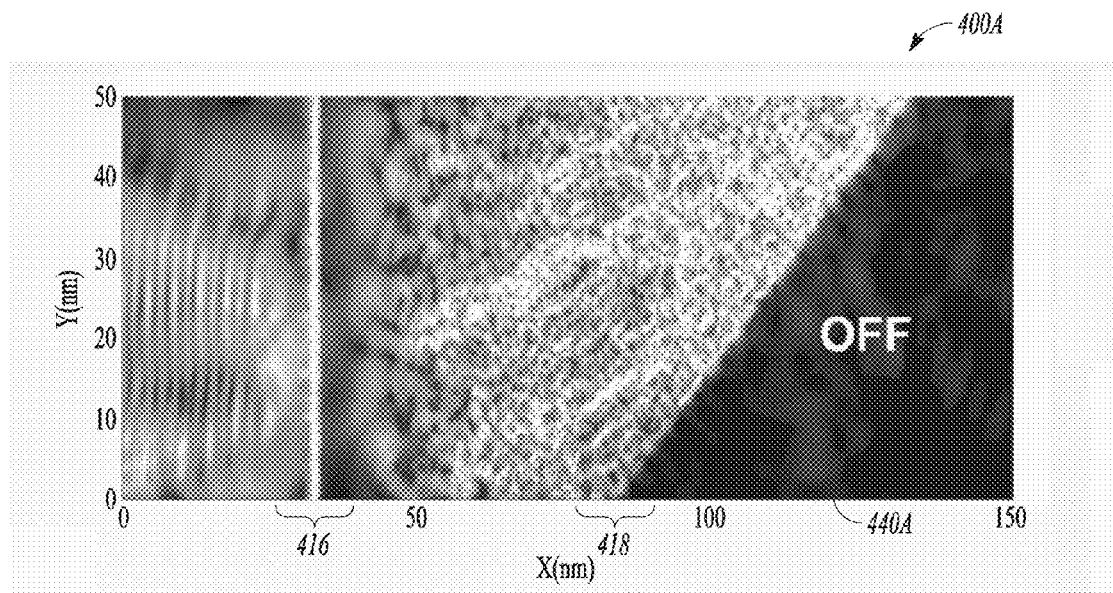
FIGS. 4A and 4B illustrates generally illustrative examples of numerical simulation of an OFF state (in FIG. 4A) and an ON state (in FIG. 4B) of a graphene switching device, such as including a structure as shown in the illustrative example of FIG. 3.
Figure 4B:
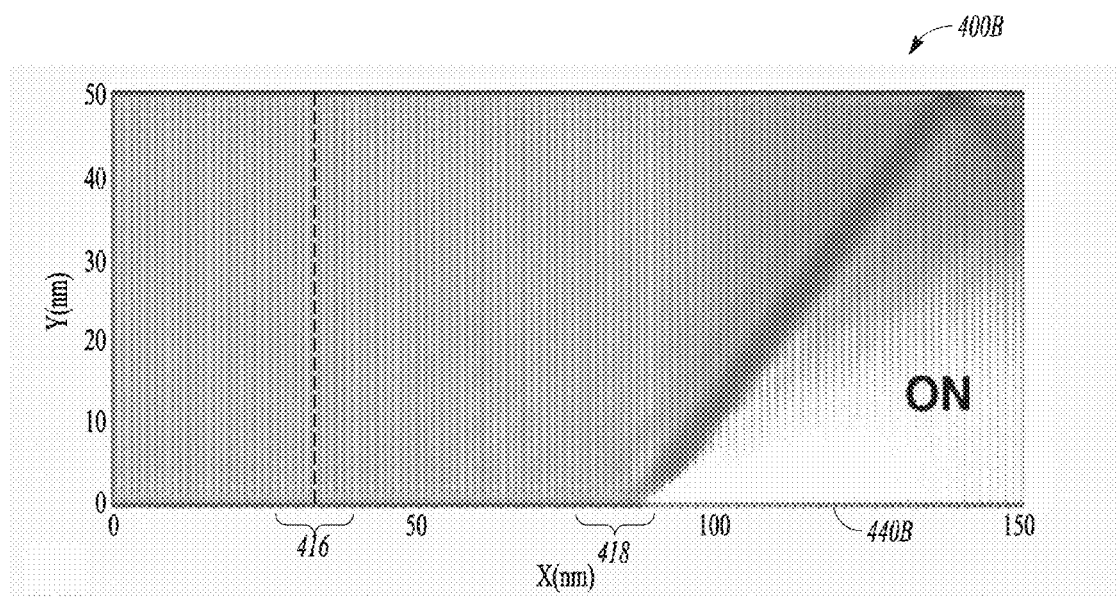

As mentioned in relation to FIG. 2, a combination of such junctions can be used to induce a transmission gap in the graphene device 300, as shown illustratively in the numerical simulations of FIGS. 4A and 4B. In the illustrative example, a width, W, of the device 300 can be about 200 nanometers, the first and second gaps $d_1$ and $d_2$ can be about 20 nanometers, and the angle, $\delta$, can be about 45 degrees.

FIGS. 4A and 4B illustrates generally illustrative examples of numerical simulation of an OFF state 400A (in FIG. 4A) and an ON state 400B (in FIG. 4B) of a graphene switching device, such as including a structure as shown in the illustrative example of FIG. 3. Carrier trajectories expected in a device as shown illustrative in FIG. 3 can be simulated, such as using a Non-Equilibrium Green's function Formalism (NEGF):

$$\mathscr{G} = (EI - H - U - \Sigma_1 - \Sigma_2)^{-1} \tag{EQN. 1}$$

H can represent a Hamiltonian matrix of graphene, described with a minimal one $p_z$ orbital basis per carbon atom with $t_0 = -3$ eV being the hopping parameter. $\Sigma 1;2$ can represent the self-energy matrices for the semi-infinite source and drain leads, assumed to be extensions of the graphene sheet (e.g., assuming excellent contacts) and $\Gamma 1;2$ can represent corresponding anti-Hermitian parts representing an energy level broadening associated with charge injection and removal. U can represent a device 300 electrostatic potential. A current from ith atom to jth atom can be determined using:

$$I_{i,j} = \frac{2q}{h} \int dE Im[\mathscr{G}^n_{i,j}(E) H_{j,i} - H_{i,j} \mathscr{G}^n_{j,i}(E)] \tag{EQN. 2}$$

An electron correlation function can be represented by $\mathscr{G}^n = \mathscr{G} \Sigma^{in} \mathscr{G}^\dagger$ and an in-scattering function can be represented by $\Sigma_{in} = \Gamma_{s} f_s + \Gamma_D f_D$. The source and drain Fermi levels can be established as $\mu_S = 0$ and $\mu_D = -qV_{DS}$. A current distribution can be determined by applying a small drain bias, $V_{DS}$. Generally, $I_{i,j}$ is nonzero only if the ith atom and jth atom are neighbors. Accordingly, a total current at an atomic site can be found by adding all the components, $I_i = \Sigma_j I_{i,j}$. The numerical simulations shown illustratively in FIGS. 4A and 4B include a very low OFF current 400A (e.g., a darker region at a bottom left of the device, in FIG. 4A) and also a very high ON current (e.g., a uniform lighter region on a bottom right, in FIG. 4B, generally illustrating good electron transmission). As mentioned above, in an OFF state, a configuration of the device includes an induced transmission gap instead of a bandgap. Such a transmission gap generally suppresses transmission of all conduction channels depending upon gate voltages by redirecting the electrons towards the source. By contrast, a bandgap does not inject those channels in the first place and thus cannot attain the desired high ON current when needed. The large ON current shown in FIG. 4B is larger than generally-available silicon-based MOSFETs per unit of device width and a low OFF current is comparable to silicon and generally has a much steeper transition from ON-to-OFF than silicon.

FIG. 5 illustrates generally a view of an illustrative example of a graphene switching device 500, such as can include a graphene layer 520 upon a dielectric layer 522, and various electrodes to provide a dual angled-gate configuration. The device 500 of FIG. 5 can operate according to principles similar to the device 300 of FIG. 3, but having enhanced performance by comparison. The device 500 can include a first junction region 516 corresponding to a first junction established by a first electrode 524, a gap, $d_1$, and a second electrode 526. The device 500 can include a second junction region 518 established by the second electrode 526, a second gap, $d_2$, and a third electrode 528. The second gap, $d_2$, can be angled as in the example of FIG. 3. By contrast with FIG. 3, the first gap, $d_1$, is also angled so as not to be parallel nor perpendicular to a longitudinal axis, L, of the device 500. In the example of FIG. 5, the first gap, $d_1$, is angled or "tilted" in a direction opposite the second gap, $d_2$.

Each of the junction regions 516 and 518 can exploit a chiral tunneling effect that conserves pseudospin index and maximizes electron transmission at normal incidence via Klein tunneling, particularly when such junctions are "smooth." A "smooth" junction generally refers to establishing a p-to-n electrostatic "doping" transition over a finite, but non-zero distance about equal to the gap width (e.g., $d_1$ or $d_2$). A transmission "lobe" corresponding to electron incidence angles having maximum transmission likelihood is established by a tilt angle of the junction, (e.g., an angle $\delta_1$ or an angle $\delta_2$ as in the example of FIG. 5). Examples of such transmission lobes are shown illustratively in FIG. 6A, and a combine total transmission is illustrated generally in FIG. 6B. Transmission of electrons through the device 500 between a source electrode (e.g., a fourth electrode 512) and a drain electrode (e.g., a fifth electrode 514) can be reduced or minimized, such as by orienting the first and second gaps $d_1$, $d_2$ to have a 90 degree separation from each other, such as $\delta_1=45$ degrees in a first direction relative to a line orthogonal to the longitudinal axis, L, and $\delta_2=45$ degrees in the opposite direction of the line orthogonal to the longitudinal axis, L, as shown in FIG. 5.

Figure 6A:
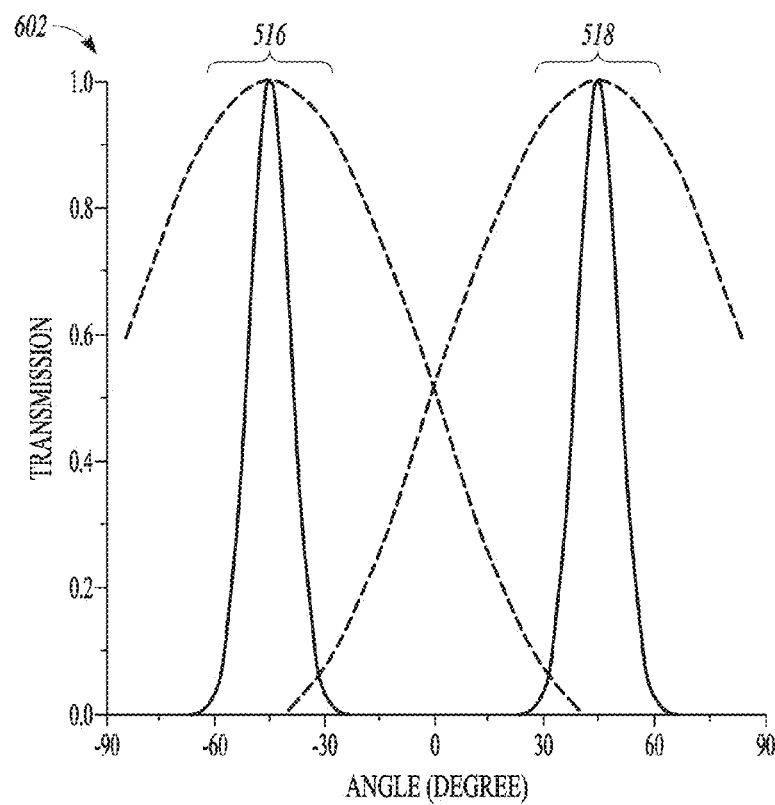
FIG. 6A illustrates generally an illustrative example of analytically-modeled angle-dependent transmission values for each of the angled-gate junctions of the example of FIG. 5.
Figure 6B:
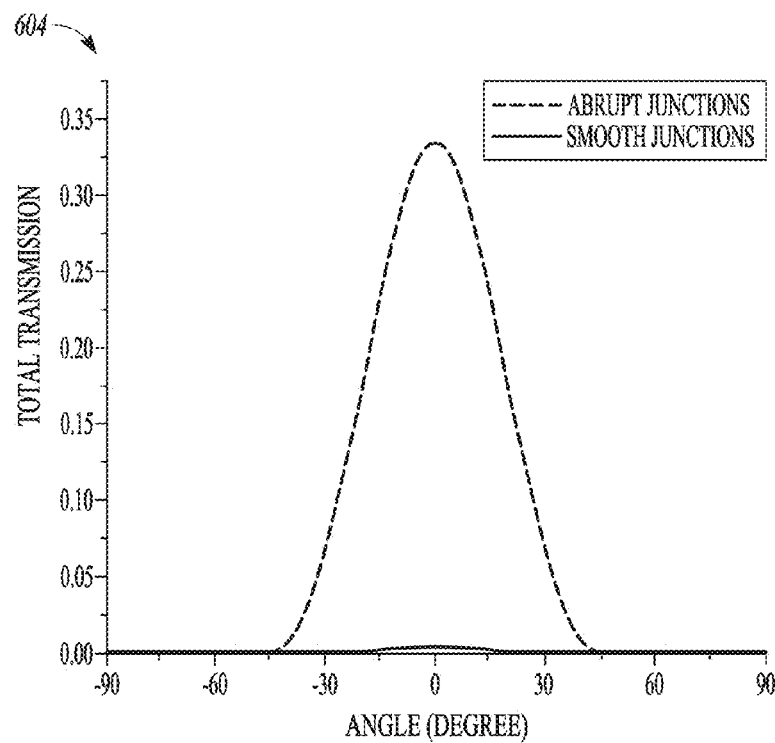
FIG. 6B illustrates generally that for a smooth junction configuration, transmission can be negligible.

FIG. 6A illustrates generally an illustrative example of analytically-modeled angle-dependent electron transmission ratios 602 for each of the angled-gate junctions of the example of FIG. 5, and FIG. 6B illustrates generally that for a smooth junction configuration, transmission 604 can be negligible in an off-state.

A first region of FIG. 6A corresponds to a tilt angle of the first junction region 516 of FIG. 5, and a second region of FIG. 6A corresponds to a tilt angle of the second junction region 518 of FIG. 5. The solid lines represent a "smooth" junction structure, such as can be established using the gate configuration and gap configuration as shown illustrative in FIG. 5, and the dotted lines represent an "abrupt" junction structure, such as can be established using a narrower gap width or using both top and bottom gate structures. Because the tilt angles of the first and second junction regions 516 and 518 are orthogonal, a corresponding transmission 604 for smooth junctions shows negligible transmission in FIG. 6B, corresponding to an OFF-state of the device 500. Use of an abrupt junction configuration (dotted line) results in some choke-off of electrons in the OFF-state bias configuration, but not to the low level indicated for a smooth junction configuration, because the transmission lobes significantly overlap for the abrupt case, as shown in FIG. 6A (dotted lines).

Figure 7A:
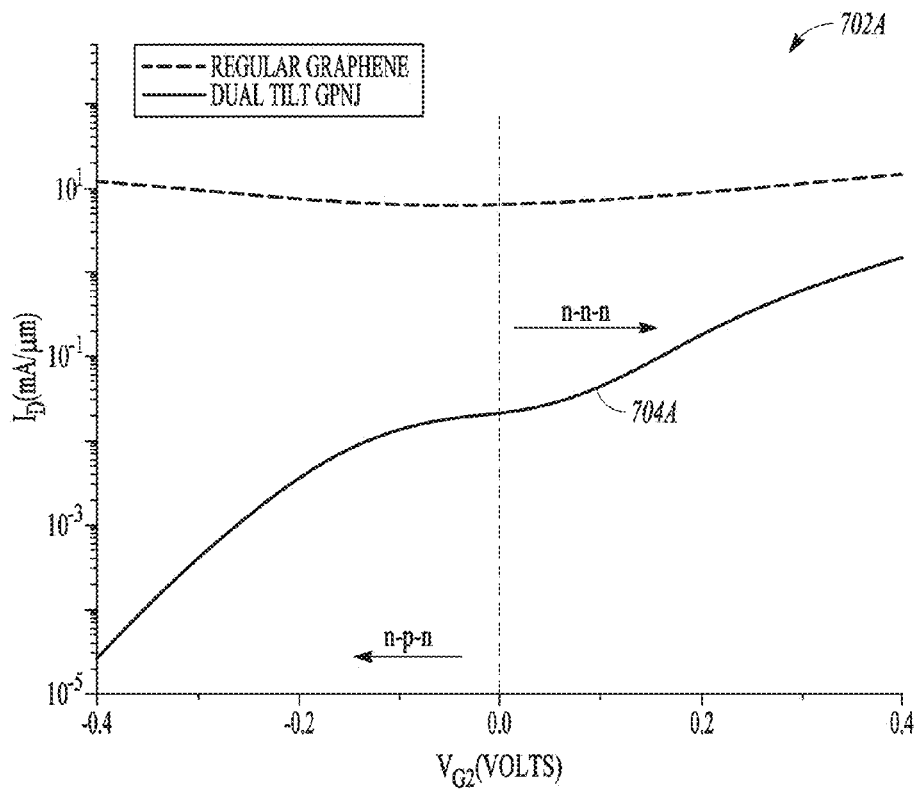
FIG. 7A illustrates generally an illustrative example of an analytically-modeled drain current as a function of a gate voltage, shown with logarithmic scaling in the vertical axis, for a graphene sheet as compared with a graphene switching device as in the example of FIG. 5.
Figure 7B:
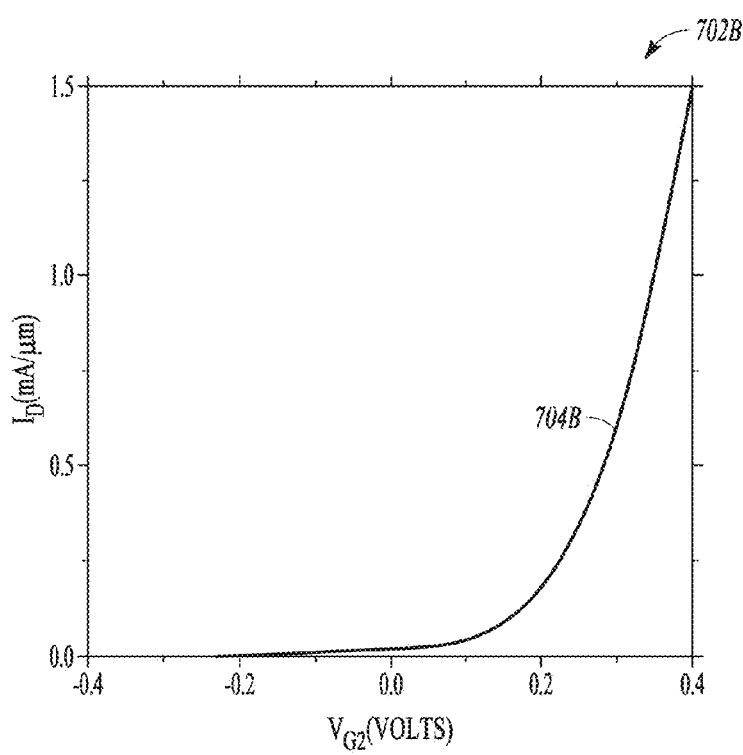
FIG. 7B illustrates generally an illustrative example similar to FIG. 7A for a graphene switching device as in the example of FIG. 5, but having a linear scale in the vertical axis.

FIG. 7A illustrates generally an illustrative example of an analytically-modeled drain current 704A as a function of a gate voltage (e.g., a voltage applied to a second gate electrode, $V_{G2}$, with respect to a first gate electrode, as for a device 500 as in the example of FIG. 5). FIG. 7A includes logarithmic scaling in the vertical axis, and a current for a gapless graphene sheet is provided by way of comparison (dashed line). For an npn biasing scheme (e.g., $V_{G2}$ is biased to a potential negative with respect to $V_{G1}$), the drain current 704A $I_D$ is less than the gapless (e.g., uniformly doped) graphene sheet by orders of magnitude. For an nnn biasing scheme (e.g., $V_{G2}$ is biased to a potential equal or positive with respect to $V_{G1}$), the drain current is degraded slightly as compared to the homogeneous gapless graphene sheet, but $I_D$ 704A is still orders of magnitude greater in this ON state than in the OFF state. FIG. 7B illustrates generally an illustrative example similar to FIG. 7A for a graphene switching device as in the example of FIG. 5, but having a linear scale in the vertical axis for the drain current of the device, $I_D$ 704B.

Figure 8:
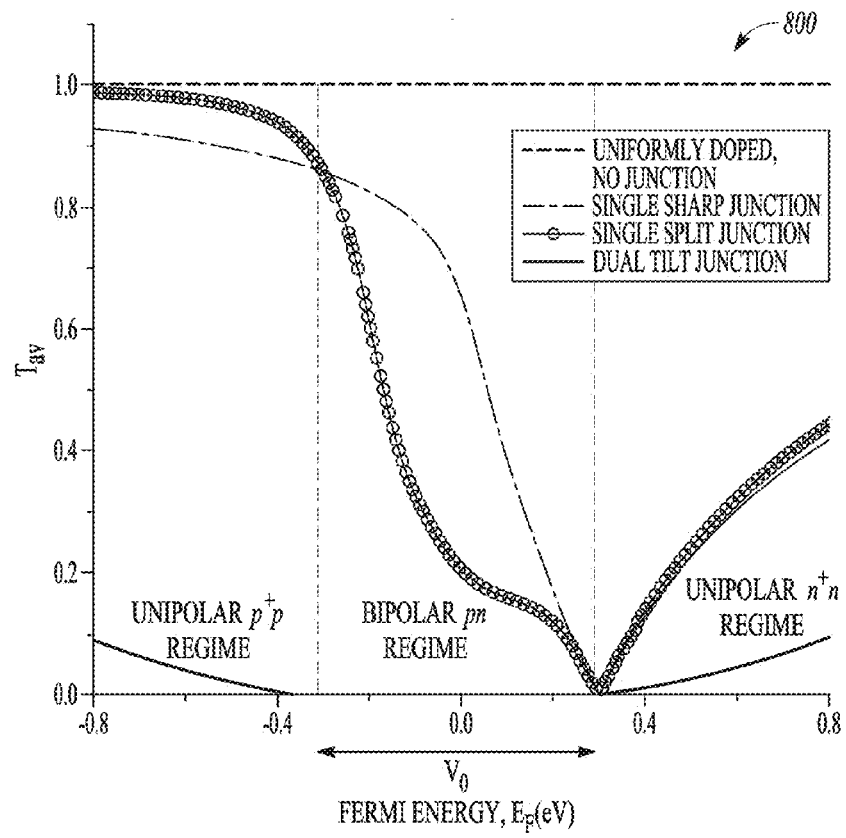
FIG. 8 illustrates generally an illustrative example of an analytically-modeled mode-averaged electron transmission as a function of Fermi energy for different electrostatically-induced "doping" profiles.

FIG. 8 illustrates generally an illustrative example of an analytically-modeled mode-averaged electron transmission 800 as a function of Fermi energy for different electrostatically-induced "doping" and junction profiles. A total transmission through a graphene heterojunction can be written as:

$$G(E_F) = G_0 \sum T(\theta) = G_0 \int \frac{T(\theta)}{\Delta \theta} d\theta \quad \text{(EQN. 3)}$$
$$= G_0 \frac{k_F}{\Delta k_y} \int T(\theta) \cos\theta d\theta$$

-continued
$$= G_0 M(E_F) \frac{1}{2} \int T(\theta) \cos\theta d\theta$$

An angular spacing between modes can be represented by $\Delta\theta = \Delta k_y/(k_y \cos\theta)$, a mode spacing can be represented by $\Delta k_y = 2\pi/W$, and a number of modes can be expressed as $M(E_F) = Wk_F/\pi$. A conductance at zero temperature can be represented by:

$$G(E_F) = G_0 \sum_{n=1}^{M(E_F)} T_n = G_0 M T_{av} \quad \text{(EQN. 4)}$$

Comparing EQN. 4 with EQN. 3, a mode-averaged transmission can be represented by:

$$T_{av}(E_F) = \frac{1}{2} \int T(\theta) \cos\theta d\theta \quad \text{(EQN. 5)}$$

A transmission through a single pn junction, where the potential changes smoothly from p to n over a distance 2d can be represented by:

$$T(\theta) = e^{-\pi k_F d \sin^2\theta} \quad \text{(EQN. 6)}$$

A wave-function prefactor can be ignored for a moderate gate split distance, 2d. $T_{av}$ can be considered separately for a single split junction, and a tilted junction.

$$G \approx G_0 M(E_F) \frac{1}{2} \int_{-\theta_0}^{\theta_0} d\theta e^{-\pi k_F d \theta^2} \quad \text{(EQN. 7)}$$
$$= G_0 \left[\frac{1}{2\sqrt{k_F d}}\right] M$$

$$T_{av} \approx \frac{1}{2\sqrt{k_F d}}$$

for a split gate. For an abrupt tilted junction, $$G \approx G_0 \int_{-\pi/2}^{\pi/2-\delta} \frac{T(\theta+\delta)}{\Delta\theta} d\theta \quad \text{(EQN. 8)}$$
$$= G_0 \left[\frac{2}{3}\cos^4\left(\frac{\delta}{2}\right)\right] M$$

The expression in EQN. 8 generally indicates a reduced density of modes at the higher angular region, and accordingly $$T_{av} = \frac{2}{3}\cos^4\left(\frac{\delta}{2}\right)$$

varies as a function of the tilt angle, $\delta$. Therefore, a resistance measurement between source and drain electrodes (e.g., $R_{Total}=1/G$) can show an increase for a device having an angled (e.g., "tilted" junction). In an example, such as a device 500 shown in FIG. 5, individual transmissions through each junction region can be represented respectively as follows (and as can be derived from EQN. 18, discussed below):

$$T_1(\theta) = e^{-\pi k_F d \sin^2(\theta + \delta_1)} \quad \text{(EQN. 9)}$$

$$T_2(\theta) = e^{-\pi k_F d \sin^2(\theta - \delta_2)} \quad \text{(EQN. 10)}$$

The tilt angle, δ, generally modifies the angles of the incoming modes. To determine a total transmission, the above two equations can be combined, generally ignoring phase coherence to determine a total transmission:

$$\frac{1-T}{T} = \frac{1}{T_1} + \frac{1}{T_2} - 2 = e^{\pi k_F d \sin^2(\theta+\delta_1)} + e^{\pi k_F d \sin^2(\theta-\delta_2)} - 2 \quad \text{(EQN. 11)}$$

An overall transmission can then be represented by:

$$T(\theta) = \frac{1}{e^{\pi k_F d \sin^2(\theta+\delta_1)} + e^{\pi k_F d \sin^2(\theta-\delta_2)} - 1} \quad \text{(EQN. 12)}$$

Accordingly, for $\delta_1 = \delta_2$, a mode-averaged transmission can be represented by:

$$T_{av}(E_F) = \frac{1}{2}\int_{-\pi/2}^{\pi/2} \frac{d\theta \cos\theta}{e^{\pi k_F d \sin^2(\theta+\delta_1)} + e^{\pi k_F d \sin^2(\theta-\delta_2)} - 1} \quad \text{(EQN. 13)}$$

$$T_{av}(E_F) \approx \frac{1}{8}\frac{1}{\sqrt{k_F d}\left(e^{\pi k_F d \sin^2\delta}\right)}$$

A junction resistance can be extracted using the expression:

$$Rj_{expt} = [R(V_{G1},V_{G2}) + R(V_{G2},V_{G1}) - R(V_{G1},V_{G1}) - R(V_{G2},V_{G2})]/2 \quad \text{(EQN. 14)}$$

The above equation generally eliminates contact and device resistance due to scattering and leaves out a resistance contribution from the pn junction only. Without being bound by theory, a total resistance $R_{Total} = 1/G$ can be represented by two contributions (e.g., a contact resistance and device resistance).

$$R_{Total} = [G_0]^{-1} \frac{1}{MT_{av}} = [G_0]^{-1}\left[\frac{1}{M} + \frac{1-T_{av}}{MT_{av}}\right] \quad \text{(EQN. 15)}$$

In presence of a pn junction with non-unity $T_{av}$, the second term can be considered as the junction resistance:

$$R_j = [G_0]^{-1}\left[\frac{1-T_{av}}{MT_{av}}\right] \quad \text{(EQN. 16)}$$

While an analytically-determined $T_{av}$ can be computed, such as using EQN. 7, $T_{av}$ can also be obtained experimentally by using values of $Rj_{expt}$ obtained via measurement and determining $T_{av}$ using EQN. 16, for example. An unknown value can include a number of modes at a particular gate voltage:

$$M = \frac{W}{\pi}\frac{\Delta E(V_G)}{\hbar v_F} \quad \text{(EQN. 17)}$$

In the example of EQN. 17, $\Delta\Sigma = \hbar v_F \sqrt{\pi C_G V_G/q}$ can represent a shift of Dirac point with gate voltage $V_G$. A gate capacitance can be determined using a parallel plate capacitor model, $$C_G = \frac{\varepsilon}{t_{ox}},$$

such as using an illustrative gate oxide thickness $t_{ox}$ of about 100 nanometers and assuming a silicon dioxide gate dielectric material.

In view of the analytical expressions above, a mode-averaged electron transmission ratio across a dual junction structure can be decomposed as shown in the following expressions:

$$T_{1,2}(\theta) \approx \left[\frac{\cos(\theta_L \pm \delta)\cos\theta_R}{\cos^2\left(\frac{\theta_L \pm \delta + \theta_R}{2}\right)}\right] \times \quad \text{(EQN. 18)}$$

$$\exp\left[-\pi d \frac{k_{FL}k_{FR}}{k_{FL}+k_{FR}}\sin(\theta_L \pm \delta)\sin(\theta_R)\right]$$

$$\frac{1}{T_{eff}} \approx \frac{1}{T_1} + \frac{1}{T_2} - 1 \quad \text{(EQN. 19)}$$

$$T_{av}(E_F) = \frac{1}{2}\int T_{eff}(\theta)\cos\theta d\theta$$

$$= \left[A\sqrt{k_F d}\ e^{\pi k_F d \sin^2\delta}\right]^{-1}$$

EQN. 19 can become vanishingly small even for a moderate doping (e.g., using a Fermi wavevector, $k_F = E_F/\hbar v_F$, and holding A as a constant, A≈8, as in EQN. 13), a gate split can be 2d and a tilt angle can be represented by δ. EQN. 18 can arise from matching pseudospinors across a junction, where L and R can denote components to left and right of a junction. The tilt angle δ modifies an incident angle by $\theta_L \pm \delta$ and an angle of refraction is related to incident angle through Snell's law, $k_{FL}\sin(\theta_L \pm \delta) = k_{FR}\sin(\theta_R)$. EQN. 19 generally assumes resistive addition of the junction resistances and ballistic flow in between. A mode count for an Ohmic-contacted sample of width, W, can be represented by $M = (Wk_F)/\pi$. A resulting total conductance, $G_0 MT_{av}$, can be negligible in the entire pn junction regime, indicating that a transmission gap ($E_G$) can exists if the carrier densities are established to have opposite polarities:

$$E_G \approx V_0 \quad \text{(EQN. 20)}$$

In EQN. 20, $V_0$ can represent a gate-induced voltage step across the junction. A high resistance is primarily contributed by a Wentzel-Kramers-Brillouin (WKB) exponential factor, which is generally valid in a pn regime, whereas a unipolar regime generally includes only the cosine prefactors that can represent a wavefunction mismatch.

In the illustrative example of FIG. 8, $T_{av}$ values can be determined numerically from EQN. 19 as a function of Fermi energy ($E_F$). FIG. 8 illustrates generally four different device and doping profiles. The top dashed line illustrates generally transmission of all modes for a ballistic uniformly doped graphene sheet. An angular (e.g., mode dependent) transmission is manifested in a single sharp (d=0) graphene pn junction and the $T_{av}$ is suppressed as shown by the line included dashes and dots, labeled "single sharp junction." Further suppression can be achieved using a single split junction (e.g., as shown in the curve including circles labeled "single split junction"). Such a split junction configuration is established using gate electrodes having a finite gap between the electrodes, resulting in a non-zero gap width, d. Such further suppression can be due to high transverse energy (mode) filtering. A mode-averaged transmission for a device 500, such as shown illustratively in FIG. 5 illustrates negligible transmission when the junctions are biased to establish a bipolar pn doping regime (e.g., as shown between the vertical dashed lines). However, both the single split junction and dual "tilt" junctions show suppression only in the bipolar doping regime, outside which the exponential scaling factor is eliminated.

A minimum current can be achieved in an npn biasing regime (e.g., corresponding to an OFF state). Over the energy window, $[\mu_S \mu_D]=[E_F EF-qV_{DS}]$, such as established by the drain voltage $V_{DS}$, $T_{av}$ can vary weakly, so that the OFF state current at zero temperature for the npn configuration can be extracted from an expression:

$$I_{OFF} = G_0 \int_{\mu_D}^{\mu_S} M(E)T_{av}(E)dE \qquad \text{(EQN. 21)}$$
$$= G_0 M(E_F)T_{av}(E_F)V_{DS}$$

EQN. 21 can be convolved with a thermal broadening function at finite temperature. For uniformly doped graphene with ballistic transport, $I_{ON}$ can represented by:

$$I_{ON}=G_0 M(E_F)V_{DS} \qquad \text{(EQN.22)}$$

A zero temperature ON-OFF ratio can be represented as:

$$\frac{I_{ON}}{I_{OFF}} \approx [T_{av}(E_F)]^{-1} \sim A\sqrt{k_F d} \left(2e^{\pi k_F d \sin^2 \delta}\right) \qquad \text{(EQN. 23)}$$

As the biasing regime changes from an npn to nnn regime, as shown in FIG. 6A, a significant change in a dual tilted GPNJ device drain current is illustrated with varying gate voltage $V_{G2}$ at room temperature and finite drain bias ($V_{DS}$), as compared with a regular zero bandgap graphene-based switch. However, from a nin to nnn regime, little change in GPNJ current occurs when viewed on a log scale. But, towards the npn regime, a current change of three orders of magnitude or more can occur while the Fermi window remains mostly within the transmission gap.

Referring to FIG. 7, an ON current is reduced only slightly when comparing a single sharp junction device to a dual tilted device (e.g., as in FIG. 5), while the OFF current is reduced by orders of magnitude (e.g., within the pn regime between the dashed lines in FIG. 7). Without being bound by theory, it is believed that a reduction in ON current comes due to the fact that the doping is not quite uniform at the ON state across the n+n collimator (maintained at slightly unequal doping to avoid a large voltage swing), whereupon a wave-function mismatch leads to a lower current. Fully ballistic transport assuming an Ohmic-contacted high quality sample would generally provide an intrinsic ON current in the milliamp-per-millimeter (mA/mm) range. For numerical determinations herein, illustrative gate parameters used are $|\delta_1|=|\delta_2|=\delta=45$ degrees, $d_1=d_2=20$ nm, $V_{G1}=V_{G3}=+1V$, $V_{DS}=0.4V$, and $V_{G2}$ varies as shown illustratively.

Figure 9:
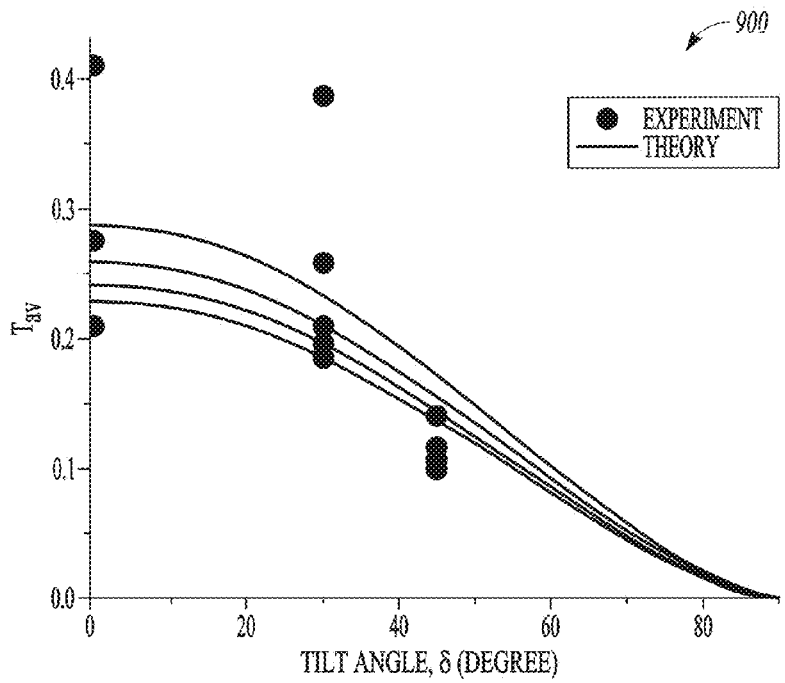
FIG. 9 illustrates generally a comparison between analytically-modeled mode-averaged electron transmission as a function of "tilt" angle for a single tilted junction, as compared with experimentally-obtained results, illustrating generally the validity of a scaling law concerning such a tilt angle.

FIG. 9 illustrates generally a comparison 900 between analytically-modeled mode-averaged electron transmission as a function of "tilt" angle for a single tilted junction, as compared with experimentally-obtained results, illustrating generally the validity of a scaling law concerning such a tilt angle. As mentioned in other examples, an effect of incident-angle-dependent or "chiral" transmission across an angled junction (e.g., as shown structurally in FIGS. 3 and 5) can be used to provide a graphene switching device, in the presence of charge puddles and edge reflection.

A mode-averaged transmission, such as corresponding to the dots shown in FIG. 9, can be experimentally determined using a measured junction resistance for a single split junction, for varying tilt angles as described using the approach discussed previously above. For an abrupt tilted junction, $T_{av}=\frac{2}{3}\cos^4(\delta/2)$ approaching the symmetric pn doping limit and can represent an electronic analog of optical Malus' law. A reduction in $T_{av}$ can occur due to an angular shift of transmission lobe (e.g., as shown in FIG. 4B) in a low angular mode density region. A numerically evaluated $T_{av}$ generalized for a tilted split junction (e.g., as shown by solid lines in FIG. 9) generally agrees with experimentally-determined data (dots) across various doping conditions. Such an angular dependence persists, for multiple diffusive samples. A scaling of $T_{av}$ in experiment thus confirms an angular shift of the transmission lobes and forms an experimental basis for the device structures illustrated generally in FIGS. 3 and 5. The illustrative example of FIG. 9 shows an absence of specular edge scattering, and without being bound by theory, such absence might be explained by a randomizing effect of roughness.

The induced transmission gap in the device examples of this document may be sensitive to gate parameters. In particular, making one of the junctions abrupt, using overlapping top and bottom gates, can produce intricacies in addition to the high ON and low OFF current. Both the geometries in FIGS. 3 and 5 have pn junctions that can be configured to filter out most or all propagating modes, but in examples including an abrupt gate split (e.g., $d_2=0$), the abruptness of the second junction can make a critical angle more sensitive to gate voltages and the transmission gap modeled in EQN. 20 may need modification.

A first junction in the example of FIG. 3 generally limits transmission primarily to the Klein tunneling mode in an OFF state, while a second junction, tilted at $\delta$, can increase an effective angle of incidence by the gate tilt angle $\delta$. Electrons are then generally reflected if the critical angle of the second junction is less than $\delta$, $$\theta_C = \sin^{-1}\left|\frac{n_3}{n_2}\right| < \delta \qquad \text{(EQN. 24)}$$

where $n_3$ and $n_2$ can represent doping concentrations on the two sides of the second junction region. A resulting transmission vanishes over a range of energies (following from EQN. 24), which can be expressed as:

$$E_G = V_0 \frac{2\sin\delta}{\cos^2\delta} \qquad \text{(EQN. 25)}$$

A tunability of a transmission gap for an abrupt junction can bear a direct impact on a rate of change of current as a function of gate voltage. For a semiconductor with fixed bandgap, this rate is generally $k_B T \ln(10)/q$ and limits the energy dissipation in binary switching. Such a limit arises from a rate of change in overlap between the band-edge and the Fermi-Dirac distribution, normally set by the Boltzmann tail. In the examples of FIGS. 3 and 5, however, a transmission gap is created artificially with a gate bias $V_0$ across a GPNJ device, and such a transmission gap can be collapsed by going from a heterogeneous (npn) biasing regime towards a homogenous doping limit (nnn) Such a collapsible transport gap will overlap with the Fermi distribution at a higher rate than in other device architectures, with a change in gate bias, leading to a subthermal switching steeper than the Landauer limit. This results in a lower gate voltage swing to turn on the device and thus reduces dissipation as compared to other device architectures.

Figure 10:
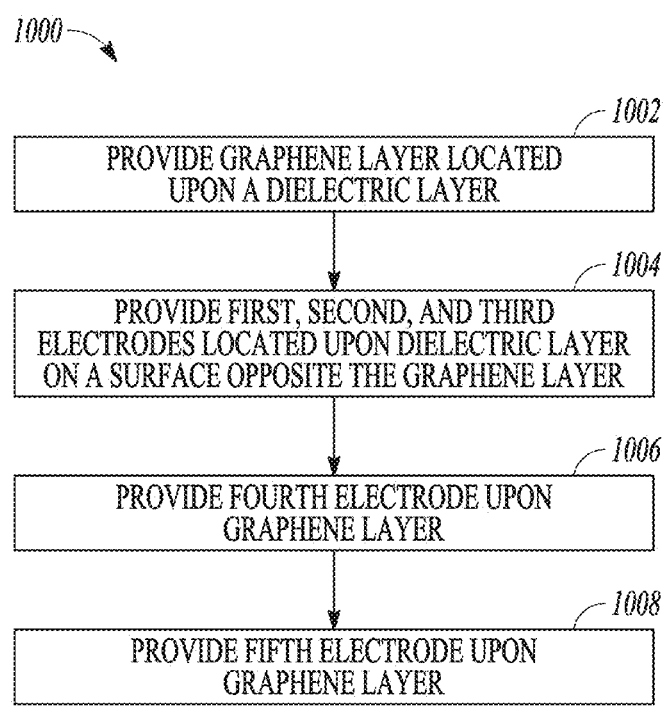
FIG. 10 illustrates generally a technique, such as a method, that can include providing a graphene switching device configuration such as shown illustrative in the examples of FIG. 3 or 5.

FIG. 10 illustrates generally a technique 1000, such as a method, that can include providing a graphene switching device configuration such as shown illustrative in the examples of FIG. 3 or 5. At 1002, a graphene layer can be provided, such as upon a dielectric layer. For example, the graphene layer can be deposited or transferred to the dielectric layer. The dielectric layer can serve as a mechanical substrate, such as including a hexagonal allotrope of boron nitride. At 1004, one or more of a first, second, and third electrode can be provided, such as on a surface of the dielectric layer opposite the graphene layer. One or more of the first, second, or third electrodes can provide gate electrodes. At 1006 a fourth electrode can be provided upon the graphene layer, such as on a surface opposite the dielectric layer. At 1008, a fifth electrode can be provided upon the graphene layer, such as laterally offset from the fourth electrode.

VARIOUS NOTES & EXAMPLES

Each of the non-limiting examples described in this document can stand on its own, or can be combined in various permutations or combinations with one or more of the other examples. The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. An electronic device, comprising:
a dielectric layer;
a graphene layer including a first surface located upon the dielectric layer; and
a first electrode, a second electrode, and a third electrode each separated from the graphene layer by the dielectric layer;
wherein the first and second electrodes are spaced apart along the dielectric layer to define a first gap between the first and second electrodes;
wherein the second and third electrodes are spaced apart along the dielectric layer to define a second gap between the second and third electrodes;
wherein the sidewalls of the first and second electrodes defining the first gap are perpendicular with respect to a longitudinal axis of the electronic device and the sidewalls of the second and third electrodes defining the second gap are angled with respect to the longitudinal axis of the electronic device;
wherein the graphene layer includes a second surface opposite the first surface; and wherein the electronic device includes:
a fourth electrode located upon the second surface of the graphene layer at a location along the longitudinal axis of the electronic device; and
a fifth electrode located upon the second surface of the graphene layer at a location along the longitudinal axis of the electronic device.

2. The electronic device of claim 1,
wherein at least a portion of the first electrode is laterally overlapping with the fourth electrode; and
wherein at least a portion of the third electrode is laterally overlapping with the fifth electrode.

3. The electronic device of claim 1, wherein at least one of the first through fifth electrodes comprises a metal.

4. The electronic device of claim 1, wherein the graphene layer, the dielectric layer, and the first through fifth electrodes are configured as a switching device.

5. The electronic device of claim 4, wherein the fourth electrode is configured as a source electrode;
wherein the fifth electrode is configured as a drain electrode;
wherein the first, second, and third electrodes are configured as gate electrodes.

6. The electronic device of claim 5, wherein the first gap, the first electrode, the second electrode, a first portion of the dielectric layer, and a first portion of the graphene layer are configured to provide a first induced heterojunction in response to a voltage applied across the first and second electrodes.

7. The electronic device of claim 6, wherein the second gap, the second electrode, the third electrode, a second portion of the dielectric layer, and a second portion of the graphene layer are configured to provide a second induced heterojunction in response to a voltage applied across the second and third electrodes.

8. The electronic device of claim 4, wherein conduction state of the switching device between the fourth and fifth electrodes is established using respective voltages applied at the first, second, and third electrodes.

9. The electronic device of claim 1, wherein at least one of the first gap or the second gap is about 20 nanometers wide.

10. The electronic device of claim 1, wherein the graphene layer comprises a graphene ribbon having a width of about 200 nanometers along an axis perpendicular to the longitudinal axis of the electronic device.

11. The electronic device of claim 1, wherein the second gap is angled to provide a gap orientation of about 45 degrees with respect to an axis perpendicular to the longitudinal axis.

12. The electronic device of claim 1, wherein the dielectric layer defines a substrate of the electronic device.

13. The electronic device of claim 1, wherein the dielectric layer comprises boron nitride.

14. A method of forming an electronic device, comprising:
providing a graphene layer including a first surface located upon a dielectric layer and a second surface opposite the first surface;
providing a first electrode, a second electrode, and a third electrode each separated from the graphene layer by the dielectric layer;
providing a fourth electrode located upon the second surface of the graphene layer at a location along a longitudinal axis of the electronic device wherein at least a portion of the first electrode is laterally overlapping with the fourth electrode; and
providing a fifth electrode located upon the second surface of the graphene layer at a location along the longitudinal axis of the electronic device wherein at least a portion of the third electrode is laterally overlapping with the fifth electrode;
wherein the first and second electrodes are spaced apart along the dielectric layer to define a first gap between the first and second electrodes;
wherein the second and third electrodes are spaced apart along the dielectric layer to define a second gap between the second and third electrodes; and
wherein the sidewalls of the first and second electrodes defining the first gap are perpendicular with respect to the longitudinal axis of the electronic device and the sidewalls of the second and third electrodes defining the second gap are angled with respect to the longitudinal axis of the electronic device.

* * * * *